United States Patent
Inoue

(10) Patent No.: US 9,958,315 B2
(45) Date of Patent: May 1, 2018

(54) CAPACITIVE SENSOR, ACOUSTIC SENSOR AND MICROPHONE

(71) Applicant: OMRON Corporation, Kyoto-shi, Kyoto (JP)

(72) Inventor: Tadashi Inoue, Kyoto (JP)

(73) Assignee: OMRON Corporation, Kyoto-shi (JP)

(*) Notice: Subject to any disclaimer, the term of this patent is extended or adjusted under 35 U.S.C. 154(b) by 0 days. days.

(21) Appl. No.: 14/842,871

(22) Filed: Sep. 2, 2015

(65) Prior Publication Data

US 2015/0369653 A1  Dec. 24, 2015

Related U.S. Application Data

(63) Continuation of application No. PCT/JP2013/074205, filed on Sep. 9, 2013.

(30) Foreign Application Priority Data

Mar. 12, 2013  (JP) .................................. 2013-049738

(51) Int. Cl.
*H04R 19/00*   (2006.01)
*G01H 11/06*   (2006.01)
*H04R 19/04*   (2006.01)

(52) U.S. Cl.
CPC ........... *G01H 11/06* (2013.01); *H04R 19/005* (2013.01); *H04R 19/04* (2013.01);
(Continued)

(58) Field of Classification Search
CPC ...... H04R 19/04; H04R 19/005; G01H 11/06; H01L 2224/48091; H01L 2224/48137; H01L 2924/15151; H01L 2924/16152
(Continued)

(56) References Cited

U.S. PATENT DOCUMENTS 5,490,220 A * 2/1996 Loeppert ............... B81B 3/0072
                                                        381/113
6,535,460 B2 * 3/2003 Loeppert ............... B81B 3/0072
                                                        367/181
(Continued)

FOREIGN PATENT DOCUMENTS

CN       101180917 A      5/2008

OTHER PUBLICATIONS

The Chinese Office Action dated Nov. 2, 2017 in the counterpart Chinese patent application.
(Continued)

*Primary Examiner* — Jason R Kurr
(74) *Attorney, Agent, or Firm* — Metrolexis Law Group, PLLC

(57) ABSTRACT

A chamber that penetrates vertically is formed in a silicon substrate. A diaphragm is arranged on the upper surface of the silicon substrate so as to cover the upper opening of the chamber. Leg pieces are provided in corner portions of the diaphragm, within the diaphragm. The diaphragm and the leg pieces are separated by slits, and the leg pieces extend in the diagonal directions of the diaphragm. The leg pieces are connected to the diaphragm at the ends on the outer peripheral side of the diaphragm, and the ends on the central side of the diaphragm are supported by anchors provided on the upper surface of the silicon substrate. A back plate is provided above the silicon substrate so as to cover the diaphragm, and a fixed electrode plate is provided on the lower surface of the back plate so as to oppose the diaphragm.

17 Claims, 16 Drawing Sheets

(52) U.S. Cl.
CPC ............ *H01L 2224/48091* (2013.01); *H01L 2224/48137* (2013.01); *H01L 2924/15151* (2013.01); *H01L 2924/16152* (2013.01)

(58) Field of Classification Search
USPC .................................................. 381/113, 174
See application file for complete search history.

(56) References Cited

U.S. PATENT DOCUMENTS

| | | | |
|---|---|---|---|
| 2008/0175418 A1* | 7/2008 | Zhang .................. | B81B 3/0027 381/174 |
| 2008/0212409 A1 | 9/2008 | Lutz | |
| 2008/0232615 A1* | 9/2008 | Song .................... | H04R 19/005 381/174 |
| 2009/0190782 A1 | 7/2009 | Suzuki et al. | |
| 2010/0065930 A1* | 3/2010 | Nakatani ............. | B81C 1/00476 257/415 |
| 2010/0158279 A1 | 6/2010 | Conti et al. | |
| 2010/0158280 A1* | 6/2010 | Coronato ............. | B81B 3/0072 381/174 |
| 2012/0091546 A1* | 4/2012 | Langereis ............ | B81B 3/0072 257/416 |
| 2014/0161290 A1* | 6/2014 | Jenkins ................ | B81B 3/0021 381/174 |

OTHER PUBLICATIONS

The Chinese search report dated Oct. 24, 2017 in the counterpart Chinese patent application.

\* cited by examiner

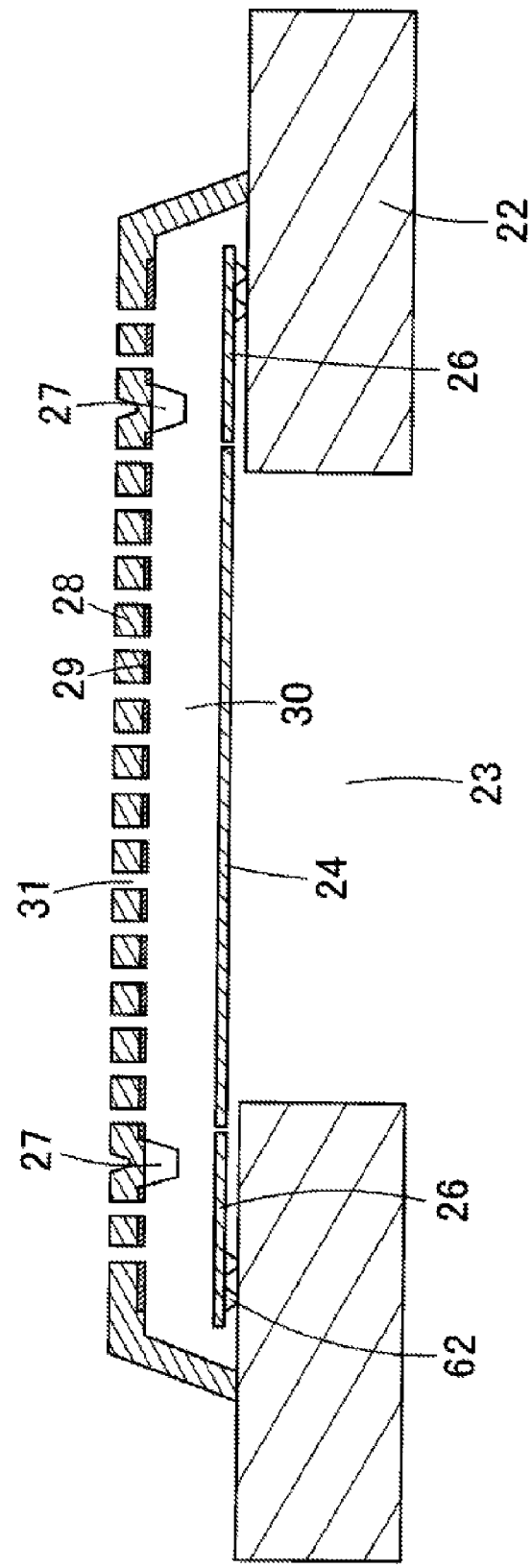

CAPACITIVE SENSOR, ACOUSTIC SENSOR AND MICROPHONE

TECHNICAL FIELD

The present invention relates to a capacitive sensor, an acoustic sensor, and a microphone. Specifically, the present invention relates to a capacitive sensor constituted by a capacitor structure that is made up of a vibrating electrode plate (diaphragm) and a fixed electrode plate. The present invention also relates to an acoustic sensor (acoustic transducer) that converts acoustic vibration into an electrical signal and outputs it, and a microphone that uses the acoustic sensor.

RELATED ART

Among diaphragms used in acoustic sensors, there are diaphragms that are supported by leg pieces in order to increase the amount of displacement of the diaphragm caused by acoustic vibration and thus improve the sensitivity of the acoustic sensor. FIG. 1(A) is a plan view showing a conventional acoustic sensor. Note that the back plate and the fixed electrode plate have been removed to expose the diaphragm in FIG. 1(A).

In the acoustic sensor shown in FIG. 1(A), a rectangular diaphragm 12 is arranged on the upper surface of a substrate 11 so as to cover a chamber (not shown) formed in the substrate 11. Leg pieces 13 extend diagonally outward from the corner portions of the diaphragm 12. Four anchors 14 are provided on the upper surface of the substrate 11 at the edges of the chamber, and the lower surfaces of tip portions of the leg pieces 13 are respectively supported by the anchors 14. Accordingly, the diaphragm 12 is supported by the leg pieces 13 that have low rigidity on the upper surface of the substrate 11, thus having a structure that undergoes a large amount of vertical displacement due to acoustic vibration. Acoustic sensors having a diaphragm with this type of structure are disclosed in Patent Document 1 and Patent Document 2, for example.

However, in the case of a structure in which the leg pieces 13 extend outward from the diaphragm 12 as in FIG. 1(A), the diaphragm 12 does not exist in the region between one leg piece 13 and another leg piece 13, that is to say the region that is hatched in FIG. 1(B), and this region is not effectively utilized. For this reason, the area of the substrate is larger than the area of the diaphragm, and this has been an obstructing factor when reducing the size of the acoustic sensor. Alternatively, the area of the diaphragm is smaller with respect to the same substrate size, and thus the sensitivity of the acoustic sensor decreases.

If an attempt is made to increase the area of the diaphragm 12 with the support structure shown in FIG. 1(A), it is conceivable to extend the diaphragm 12 into the region between one leg piece 13 and another leg piece 13 as shown in FIG. 2, for example. However, with the diaphragm 12 shown in FIG. 2, portions 12a that extend into the region between one leg piece 13 and another leg piece 13 are supported in a cantilevered manner by the portion supported by the leg pieces 13 (the portion that was originally the diaphragm 12 in FIG. 1(A)). For this reason, the extension portions 12a are easily influenced by warping of the diaphragm 12, and easily become warped upward or downward. The direction and extent of this warping vary between wafers and between lots in the production process, and therefore diaphragms having the structure in FIG. 2 become factors that cause variation in acoustic sensor sensitivity and the like. Also, depending on the case, there is a risk of a warped portion 12a colliding with the substrate 11 or the back plate.

Also, the area of the diaphragm 12 can be increased by shortening the length of the leg pieces 13. However, if the length of the leg pieces 13 is shortened, the rigidity of the leg pieces 13 increases, and therefore the amount of displacement of the diaphragm 12 decreases, and the sensitivity of the acoustic sensor decreases.

RELATED ART DOCUMENTS

Patent Documents

Patent Document 1: US Patent Application No. 2010/0158279 (US 2010/0158279 A1)
Patent Document 2: US Patent Application No. 2009/0190782 (US 2009/0190782 A1)

SUMMARY OF THE INVENTION

Problem to be Solved by the Invention

An object of the present invention is to provide a capacitive sensor such as an acoustic sensor that makes it possible to improve the sensitivity while also reducing the sensor size.

Means for Solving the Problems

A capacitive sensor according to an embodiment the present invention includes: a substrate having a cavity that is open at least at an upper surface; a vibrating electrode plate formed above the substrate so as to cover an upper portion of the cavity; and a fixed electrode plate arranged so as to oppose the vibrating electrode plate, leg pieces that are completely surrounded by the vibrating electrode plate and are partially connected to the vibrating electrode plate; wherein the leg pieces are supported by a stationary member. Here, the vibrating electrode plate does not include the leg pieces. Also, the vibrating electrode plate is a portion capable of undergoing displacement, and does not include a portion that is fixed to the substrate and cannot undergo displacement.

In the capacitance sensor according to an embodiment of the present invention, the leg pieces that can be supported by the stationary member are completely surrounded by the vibrating electrode plate. In other words, the leg pieces are provided within the vibrating electrode plate. Accordingly, wasted regions do not appear between one leg piece and another leg piece, thus making it possible to increase the area of the vibrating electrode plate, and making it possible to improve the sensitivity of the capacitive sensor. Also, because the leg pieces are provided within the vibrating electrode plate, and the leg pieces do not extend outward from the vibrating electrode plate, it is possible to reduce the size of the capacitance sensor. Also, the portion of the vibrating electrode plate between leg pieces is not in a cantilevered state, and tensile force is exerted by the stationary member or the leg pieces, and therefore it is not likely for warping to occur in the portion between leg pieces.

In an embodiment of the capacitive sensor according to the present invention, the leg pieces are separated from the vibrating electrode plate by slits. According to this embodiment, the leg pieces and the vibrating electrode plate are separated by slits, thus making it easier for the leg pieces to undergo flexure. Accordingly, it is possible to increase the amount of displacement of the vibrating electrode plate, and it is possible to further improve the sensitivity of the capacitive sensor.

In another embodiment of the capacitive sensor according to the present invention, the leg pieces are located in an outer edge portion of the vibrating electrode plate. According to this embodiment, the vibrating electrode plate can be stably supported by the leg pieces. Also, the cavity of the substrate is not likely to decrease in size.

Also, the leg pieces may extend from locations connected to the vibrating electrode plate, in a direction toward a center of the vibrating electrode plate, or may extend from locations connected to the vibrating electrode plate, in a direction toward an outer periphery of the vibrating electrode plate.

In yet another embodiment of the capacitive sensor according to the present invention, the leg pieces are supported by the stationary member via anchors at an end portion on a side opposite to the location connected to the vibrating electrode plate. According to this embodiment, it is possible to increase the length of the deformation portions of the leg pieces, and therefore the amount of displacement of the vibrating electrode plate increases, and the sensitivity of the sensor improves.

In yet another embodiment of the capacitive sensor according to the present invention, the cavity extends into a region between the leg pieces in a view from a direction perpendicular to an upper surface of the substrate. According to this embodiment, it is possible to increase the volume of the cavity of the substrate.

Also, in the capacitive sensor according to an embodiment of the present invention, the stationary member may be the substrate, and the leg pieces may be fixed above the substrate via the anchors. Here, the leg pieces may be fixed on the substrate via anchors, or may be fixed on an insulating film or a protective film provided on the upper surface of the substrate. Alternatively, in the case where a back plate is formed above the substrate so as to cover the vibrating electrode plate, the stationary member may be the back plate, and the leg pieces may be able to be supported to a lower surface of the back plate via anchors. Also, a configuration is possible in which the stationary member is the fixed electrode plate, and the leg pieces can be fixed to the fixed electrode plate via anchors.

Among these cases, in the case in which the leg pieces are fixed to the upper surface of the substrate via anchors, a leg piece and the substrate may be electrically conductive by a conductive portion that passes through an interior of an anchor. According to this embodiment, the need to draw wiring from the vibrating electrode plate is eliminated, thus making it possible to reduce the sensor size.

An acoustic sensor according to an embodiment of the present invention is an acoustic sensor employing a capacitive sensor according to the present invention, a plurality of holes for allowing passage of acoustic vibration being formed in the back plate and the fixed electrode plate. This acoustic sensor according to an embodiment of the present invention employs the capacitance sensor according to the present invention, thus making it possible to improve the acoustic vibration detection sensitivity while also reducing the sensor size.

Also, a microphone can be constituted by combining an acoustic sensor of the present invention with a circuit portion that amplifies a signal from the acoustic sensor and outputs the amplified signal to the outside.

Note that the solution to the problems in the present invention features an appropriate combination of the above-described constituent elements, and many variations of the present invention are possible according to the combination of the constituent elements.

BRIEF DESCRIPTION OF THE DRAWINGS

FIG. 12 is a cross-sectional diagram showing an acoustic sensor according to Embodiment 3 of the present invention.

EMBODIMENTS OF THE INVENTION

Hereinafter, preferred embodiments of the present invention will be described with reference to the accompanying drawings. Note that the present invention is not limited to the following embodiments, and various design modifications can be made without departing from the gist of the present invention.

Embodiment 1

Figure 3A:
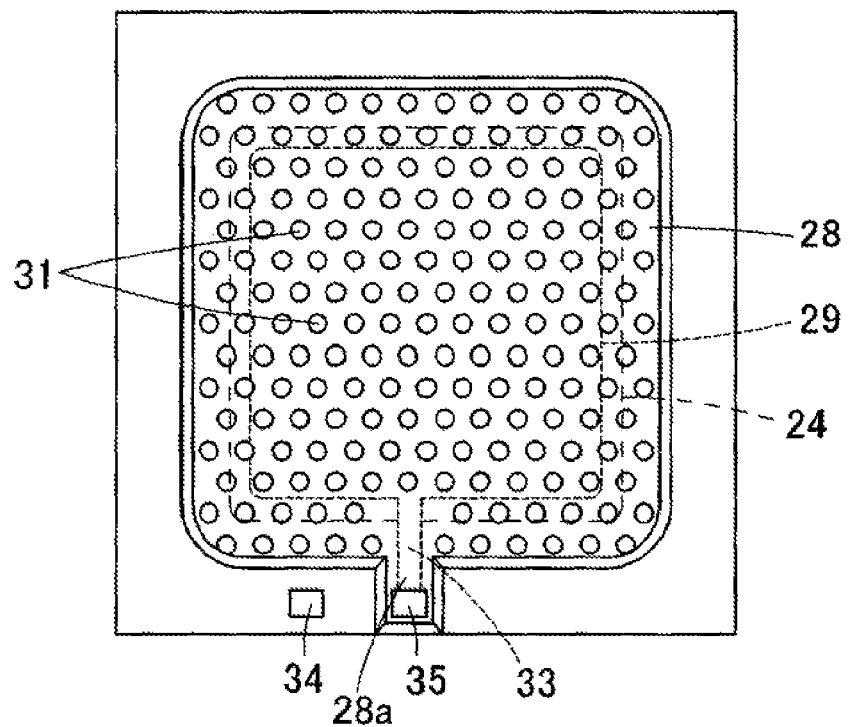
FIG. 3(A) is a plan view showing an acoustic sensor according to Embodiment 1 of the present invention.
Figure 3B:
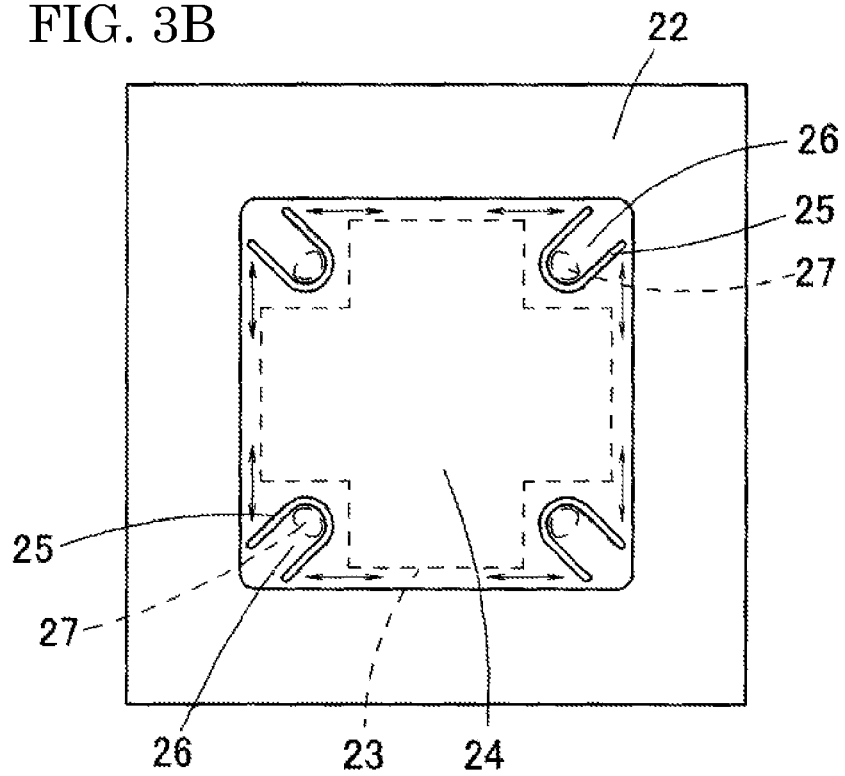
FIG. 3(B) is a plan view showing the acoustic sensor shown in FIG. 3(A), in a state in which a back plate and a fixed electrode plate have been removed to expose a diaphragm.
Figure 4A:
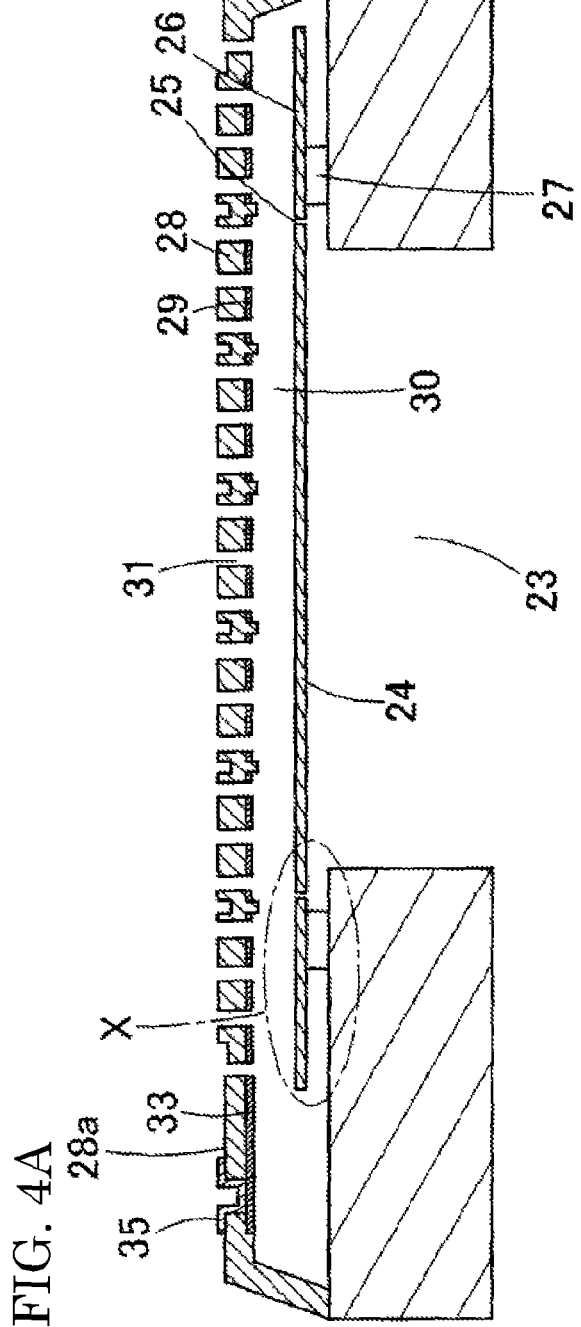
FIG. 4(A) is an enlarged cross-sectional view of the acoustic sensor shown in FIG. 3(A).
Figure 4B:
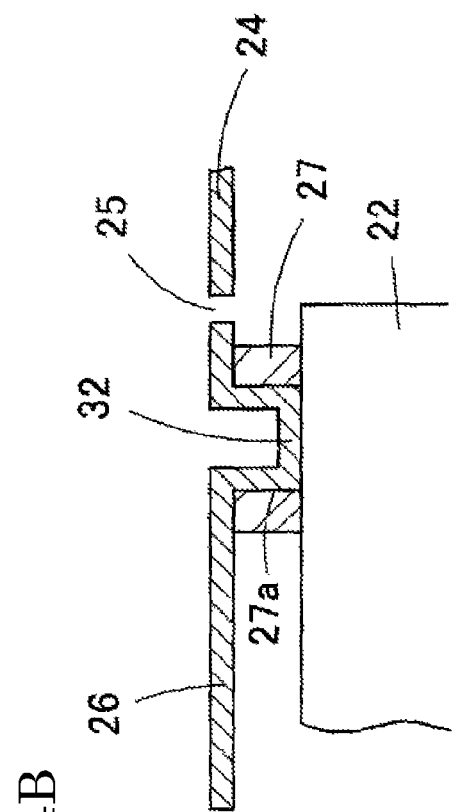
FIG. 4(B) is an enlarged view of the cross-section of a portion X in FIG. 4(A).
Figure 5:
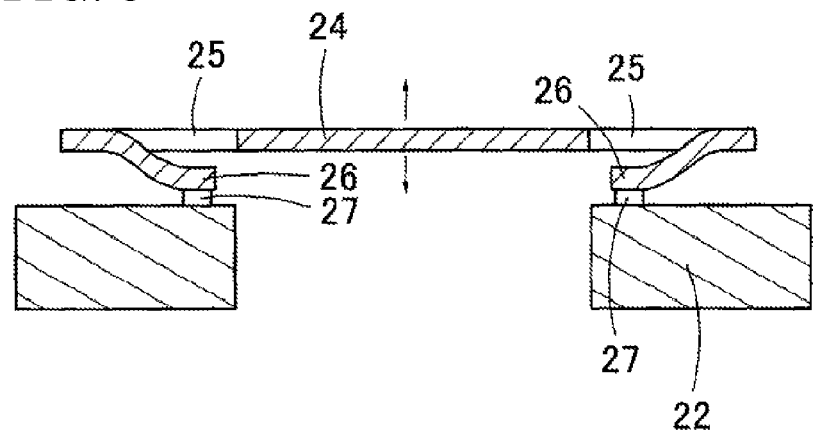
FIG. 5 is a cross-sectional diagram showing the diaphragm undergoing displacement in the acoustic sensor in FIG. 3(B).

Hereinafter, a capacitive sensor according to Embodiment 1 of the present invention, that is to say an acoustic sensor 21, will be described with reference to FIGS. 3A, 3B, 4A, 4B and 5. FIG. 3(A) is a plan view showing the acoustic sensor 21 according to Embodiment 1 of the present invention. FIG. 3(B) is a plan view showing the acoustic sensor 21 in FIG. 3(A), in a state in which a back plate 28 and a fixed electrode plate 29 have been removed to expose a diaphragm 24. FIG. 4(A) is a cross-sectional diagram of the acoustic sensor 21. FIG. 4(B) is an enlarged view of the cross-section of a portion X in FIG. 4(A). FIG. 5 is a cross-sectional diagram showing a state in which the diaphragm 24 has undergone displacement.

This acoustic sensor 21 is a capacitive element that may be manufactured using MEMS technology. As shown in FIG. 4(A), this acoustic sensor 21 includes a diaphragm 24 provided on the upper surface of a silicon substrate 22 (substrate) via anchors 27, and a fixed electrode plate 29 provided above the diaphragm 24 in opposition to the diaphragm 24.

A chamber 23 (cavity) that penetrates from the upper surface to the lower surface is formed in the silicon substrate 22. The diaphragm 24 is arranged on the upper surface of the silicon substrate 22 so as to cover the upper opening of the chamber 23. The diaphragm 24 is formed by an electrically conductive polysilicon thin film and has an approximately rectangular shape, and the diaphragm 24 itself is a vibrating electrode plate.

As shown in FIG. 3(B), leg pieces 26 are respectively provided at four corner portions of the diaphragm 24. The leg pieces 26 are each formed by providing a U-shaped slit 25 in the polysilicon thin film used for the diaphragm 24, and the leg pieces 26 are separated from the diaphragm 24 by the slits 25. The leg pieces 26 surrounded by the slits 25 extend in the diagonal directions of the diaphragm 24, and end portions located on the outer peripheral side of the diaphragm 24 are connected to the diaphragm 24. Accordingly, the leg pieces 26 are located within the diaphragm 24 in the outer edge portion of the diaphragm 24, and are completely surrounded by the diaphragm 24.

Note that there is a risk of cracking occurring at the ends of the slits 25 due to vibration of the diaphragm 24. Accordingly, it is preferable that the ends of the slits 25 are rounded so as to be arc-shaped, or terminated with circular holes.

Multiple, namely four, anchors 27 are arranged on the upper surface of the silicon substrate 22 outward of the chamber 23. The anchors 27 are located at positions in the diagonal directions of the chamber 23. The lower surfaces of the end portions of the leg pieces 26 located on the central side of the diaphragm 24 are supported by the anchors 27. In this way, the diaphragm 24 is arranged so as to cover the upper opening of the chamber 23, and floats above the upper opening of the chamber 23 and the upper surface of the silicon substrate 22.

The volume of the chamber 23 decreases due to arranging the leg pieces 26 on the inner side of the diaphragm 24, and therefore the volume of the chamber 23 is increased as much as possible. Specifically, as shown in FIG. 3(B), the chamber 23 protrudes into the regions between anchors 27, while not protruding beyond the edge of the diaphragm 24 in a view from a direction perpendicular to the upper surface of the silicon substrate 22. As a result, the chamber 23 has a cross shape in a view from above. Also, due to the chamber 23 protruding into the regions between anchors 27, it is possible to reduce the length of the gap (vent hole) across which the upper surface of the silicon substrate 22 and the lower surface of the diaphragm 24 oppose each other, and it is possible to lower the acoustic resistance of the acoustic sensor 21.

At least one of the anchors 27 has a through-hole 27a as shown in FIG. 4(B), and a portion of the leg piece 26 forms a through-hole portion 32 (conductive portion) that is embedded inside the through-hole 27a and is in contact with the upper surface of the silicon substrate 22. Because the silicon substrate 22 is electrically conductive, the diaphragm 24 conducts electricity to the silicon substrate 22 through the through-hole structure and the leg piece 26. Also, as shown in FIG. 3(A), an electrode pad 34 is provided on the upper surface of the silicon substrate 22, and the diaphragm 24 conducts electricity to the electrode pad 34 through the silicon substrate 22. According to this structure, there is no need to draw a lead-out interconnect from the diaphragm 24, which contributes to a reduction in the size of the acoustic sensor 21.

The diaphragm 24 supported by the leg pieces 26 as described above can also undergo displacement or vibrate in the vertical direction due to the flexure of the narrow leg pieces 26 as shown in FIG. 5. Accordingly, the amount of displacement of the diaphragm 24 can be increased by the leg pieces 26, and the sensitivity of the acoustic sensor 21 can be raised.

As shown in FIG. 4(A), a fixed electrode plate 29 that may be made of polysilicon is provided on the lower surface of the back plate 28, which may be made of SiN. The back plate 28 is formed with a dome shape and has a cavity portion underneath the dome, and the diaphragm 24 is covered by the cavity portion. A very small air gap 30 (air gap) is formed between the lower surface of the fixed electrode plate 29 and the upper surface of the diaphragm 24. As shown in FIGS. 3(A) and 4(A), a bulge portion 28a protrudes from a portion of the back plate 28, in a direction toward the outer periphery of the upper surface of the silicon substrate 22. A lead-out interconnect 33 is drawn out from the fixed electrode plate 29 along the lower surface of the bulge portion 28a. An electrode pad 35 provided on the upper surface of the bulge portion 28a is connected to the tip of the lead-out interconnect 33. Accordingly, the fixed electrode plate 29 conducts electricity to the electrode pad 35.

Many acoustic holes 31 (acoustic holes) for allowing the passage of acoustic vibration are formed in the back plate 28 and the fixed electrode plate 29 so as to penetrate from the upper surface to the lower surface. As shown in FIG. 3(A), the acoustic holes 31 are arranged regularly. In the illustrated example, the acoustic holes 31 are arranged in a triangular manner along three directions that form 120° or 60° angles with each other, but they may be alternatively arranged in a rectangular manner or a concentric circle manner.

In the acoustic sensor 21, the fixed electrode plate 29 and the diaphragm 24 oppose each other via the air gap 30 so as to constitute a capacitor structure. When the diaphragm 24 vibrates in response to acoustic vibration, the capacitance between the fixed electrode plate 29 and the diaphragm 24 changes, and the acoustic vibration is converted into an electrical signal through this change in the capacitance.

Figure 1A:
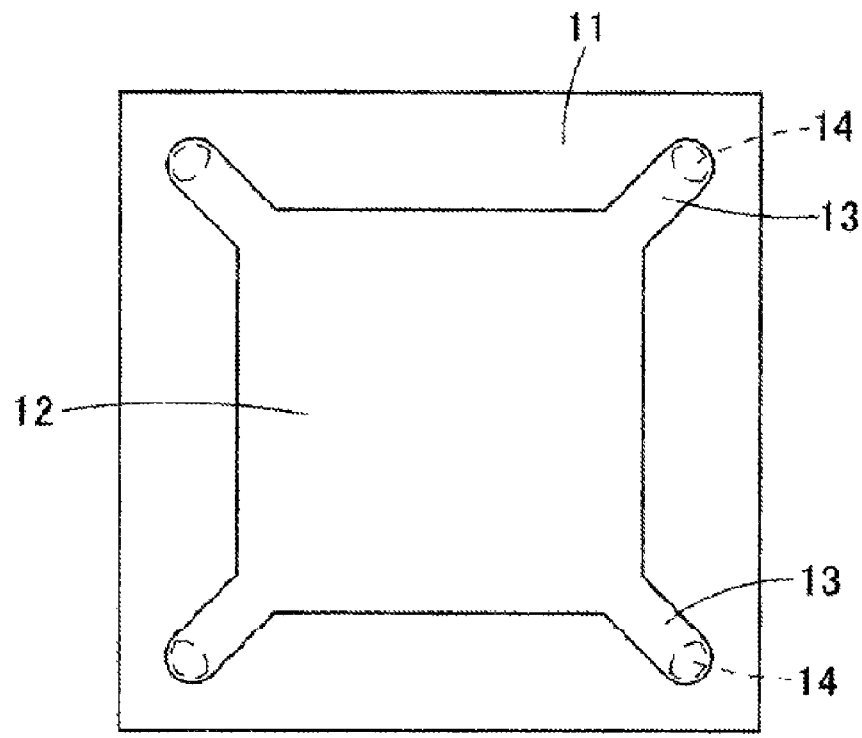
FIG. 1(A) is a plan view of a conventional acoustic sensor in a state in which a back plate and a fixed electrode plate have been removed.
Figure 1B:
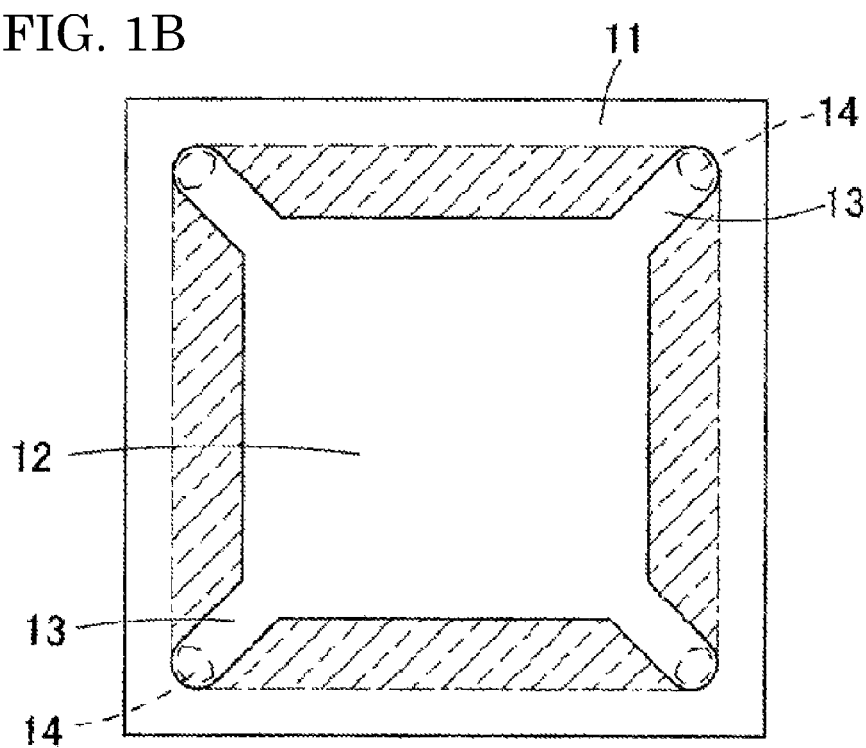
FIG. 1(B) is a diagram showing a wasted region in the acoustic sensor in FIG. 1(A).

Furthermore, because the leg pieces 26 are surrounded by the diaphragm 24 and located within the diaphragm 24 in this acoustic sensor 21, the regions between one leg piece 26 and another leg piece 26 can also be utilized as the diaphragm 24. As a result, in the case of providing the diaphragm on the upper surface of a substrate of the same size, it is possible to increase the area of the diaphragm 24, and it is possible to improve the sensitivity of the acoustic sensor 21. Alternatively, in the case where the area of the diaphragm is the same, the substrate size (sensor size) increases in the case of the diaphragm 12 shown in FIG. 1(A) because the leg pieces 13 protrude outward, whereas the substrate size does not increase in the case of the acoustic sensor 21 of the present embodiment because the leg pieces 26 are within the diaphragm 24.

Figure 2:
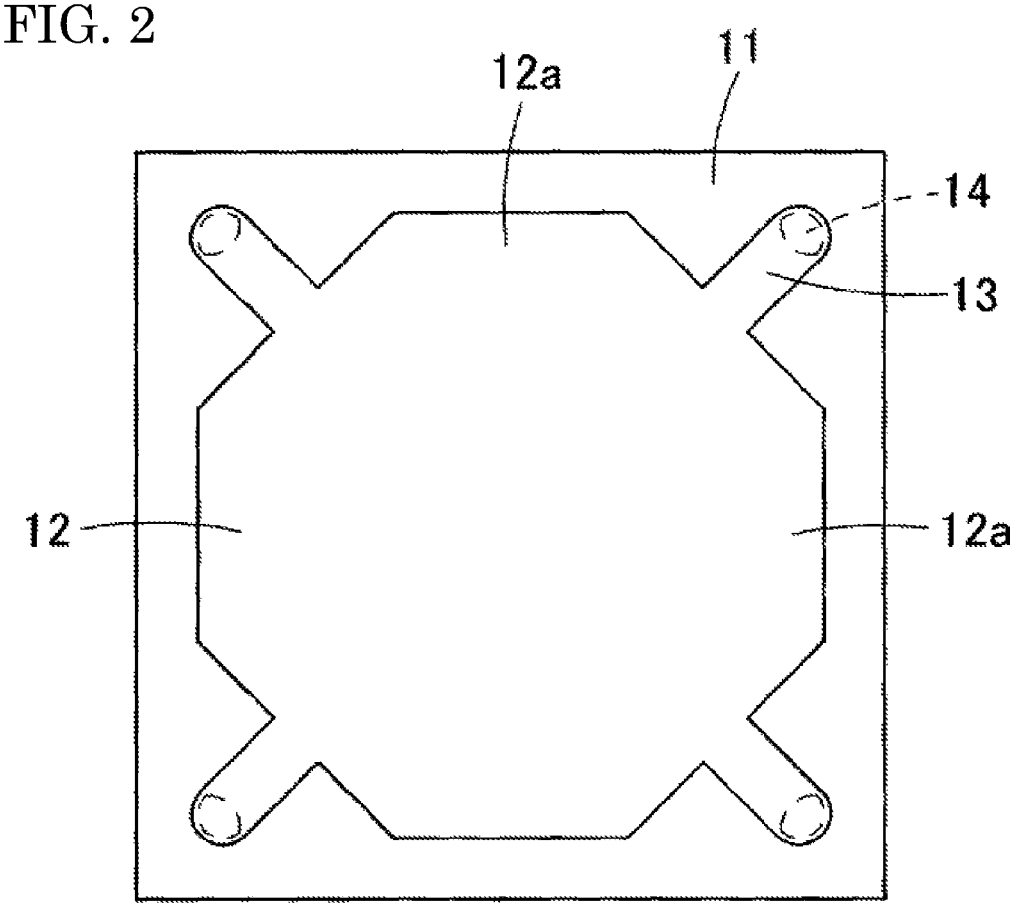
FIG. 2 is a plan view showing a comparison example in which the area of the diaphragm in FIG. 1(A) has been increased.

Also, with this acoustic sensor 21, the region of the diaphragm 24 between one leg piece 26 and another leg piece 26 is supported by the leg pieces 26 up to the outward edge, rather than being in a cantilevered state as with the extension portion 12a of the diaphragm 12 in FIG. 2. For this reason, the region of the diaphragm 24 between one leg piece 26 and another leg piece 26 is pulled taut by tensile force from the anchors 27 and the leg pieces 26 (tensile force in the directions indicated by arrows in FIG. 3(B)), and warping and distortion do not easily occur. Furthermore, with the acoustic sensor 21, even if the length of the leg pieces 26 is increased to allow the diaphragm 24 to more easily undergo displacement, the reduction in the area of the diaphragm is very small.

Therefore, according to the acoustic sensor 21 of the present embodiment, it is possible to increase the area of the diaphragm by effectively utilizing the diaphragm installation space on the substrate upper surface, and it is possible to improve the sensitivity while also achieving a reduction in the sensor size.

Modified Example

Figure 6:
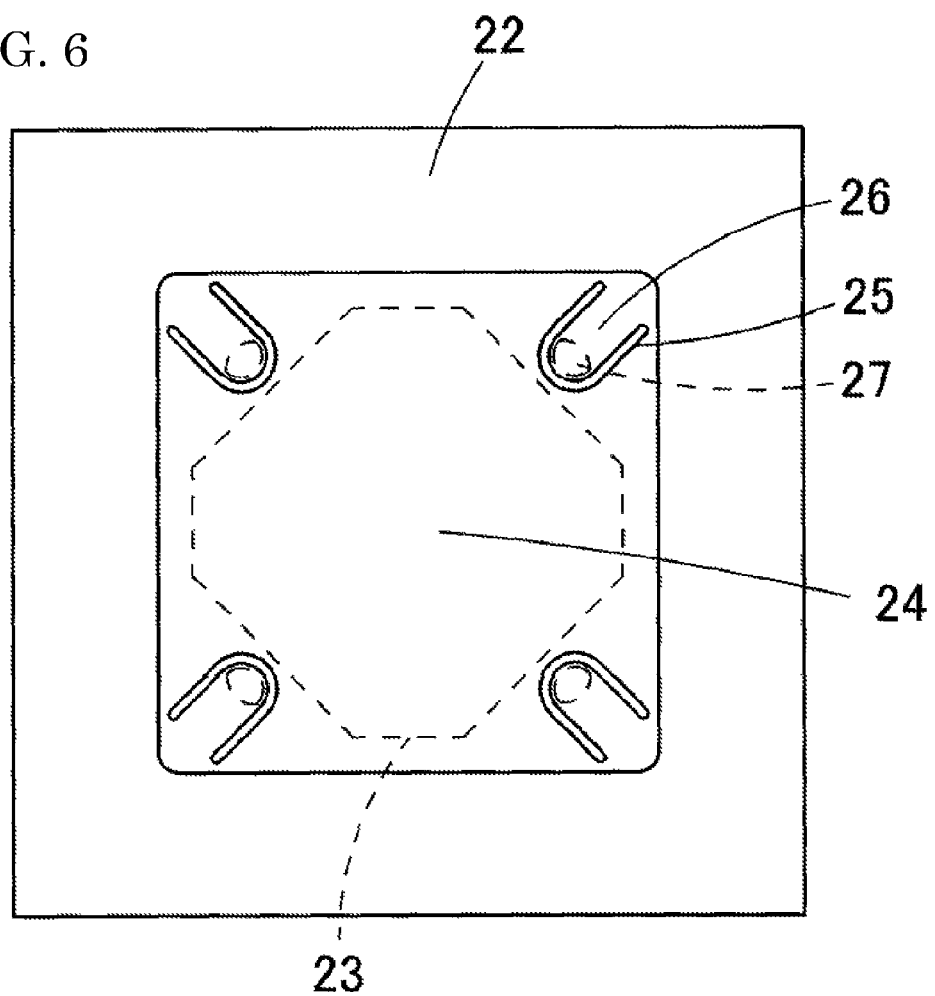
FIG. 6 is a plan view showing a modified example of the acoustic sensor of Embodiment 1 of the present invention.

FIG. 6 shows a chamber 23 having a different planar shape as a modified example of Embodiment 1. In this modified example, the chamber 23 has an approximately octagonal shape in a view from above, and the chamber 23 extends into the regions between one leg piece 26 and another leg piece 26. With the chamber 23 having this shape as well, it is possible to increase the volume of the chamber 23 and reduce the length of the vent hole.

Figure 7A:
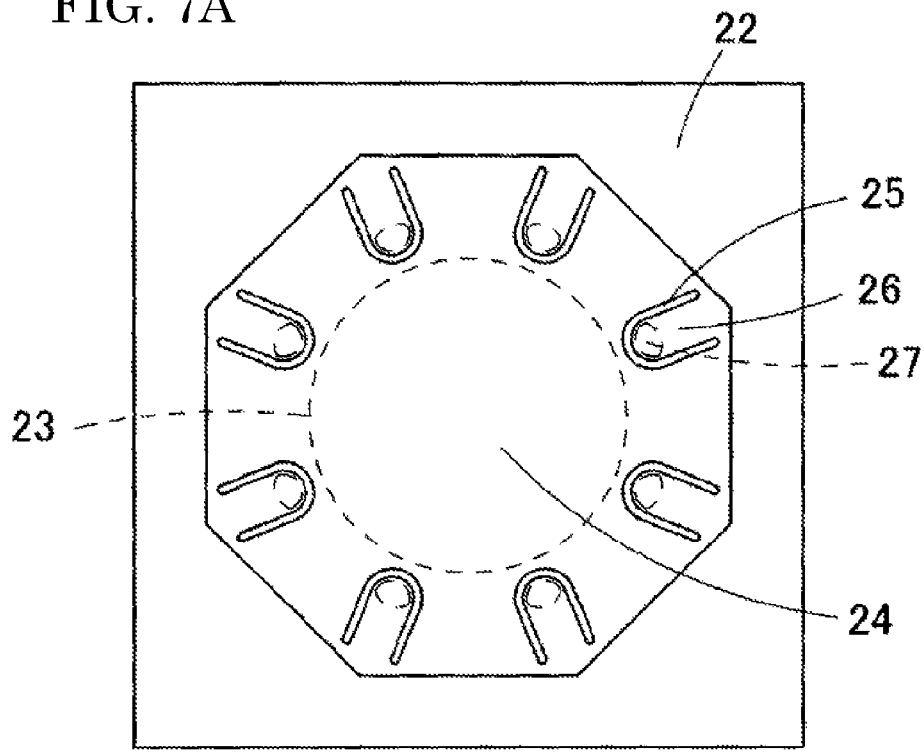
FIGS. 7(A) and 7(B) are plan views respectively showing other modified examples of the acoustic sensor of Embodiment 1 of the present invention.
Figure 7B:
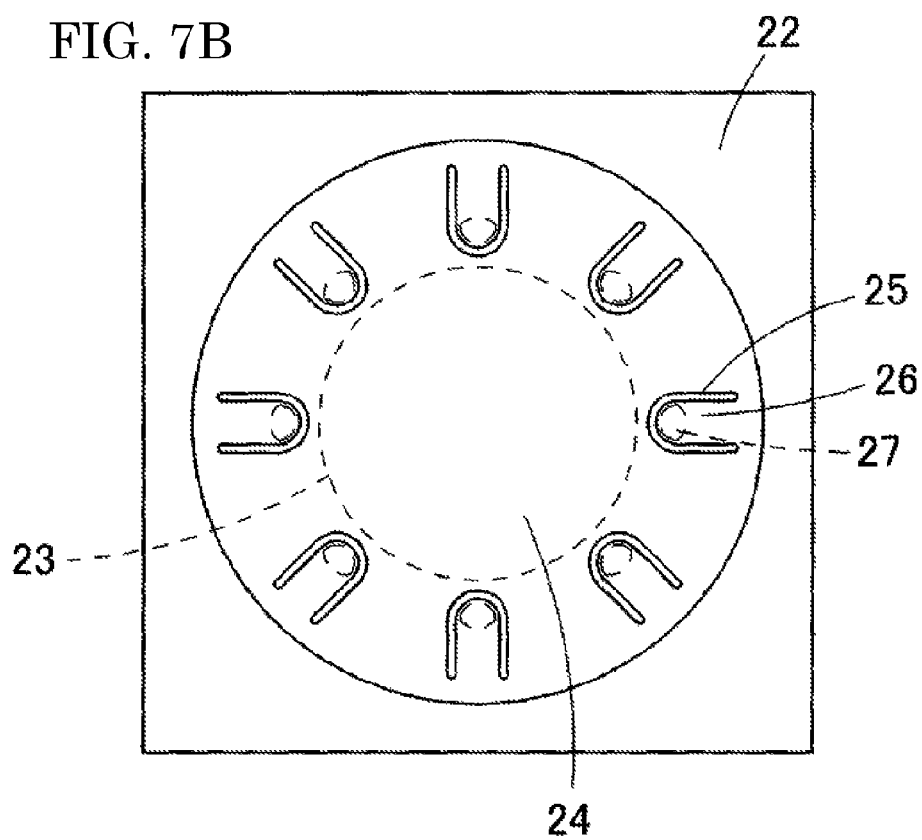

Also, the shape of the diaphragm 24 is not limited to the approximately rectangular shape shown in FIG. 3(B). For example, an octagonal diaphragm 24 as shown in FIG. 7(A) may be used, or a circular diaphragm 24 as shown in FIG. 7(B) may be used. Also, the number of and arrangement of the leg pieces 26 can also be appropriately changed in accordance with the shape of the diaphragm 24.

Embodiment 2

Figure 8A:
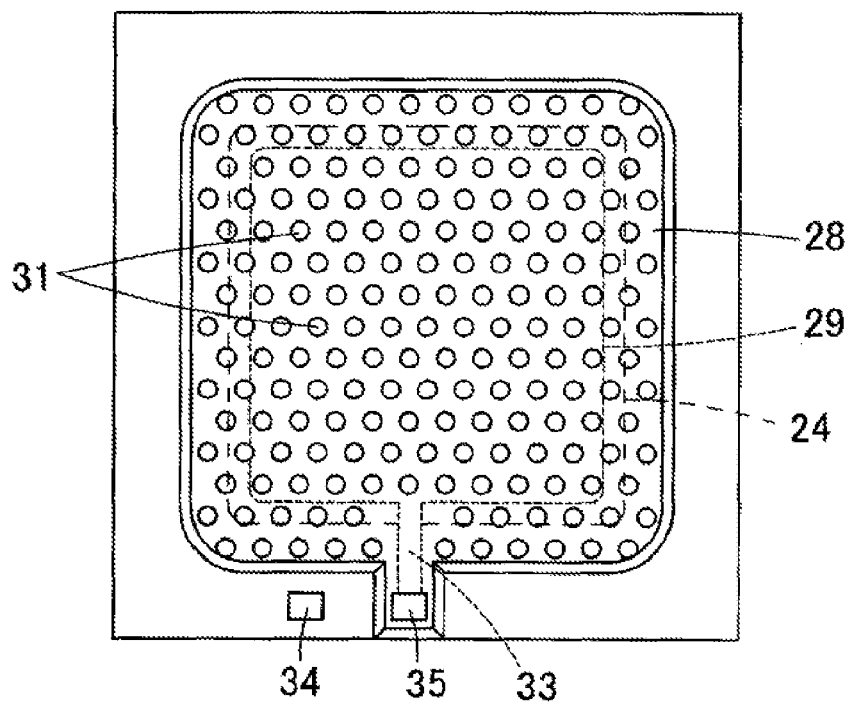
FIG. 8(A) is a plan view showing an acoustic sensor according to Embodiment 2 of the present invention.
Figure 8B:
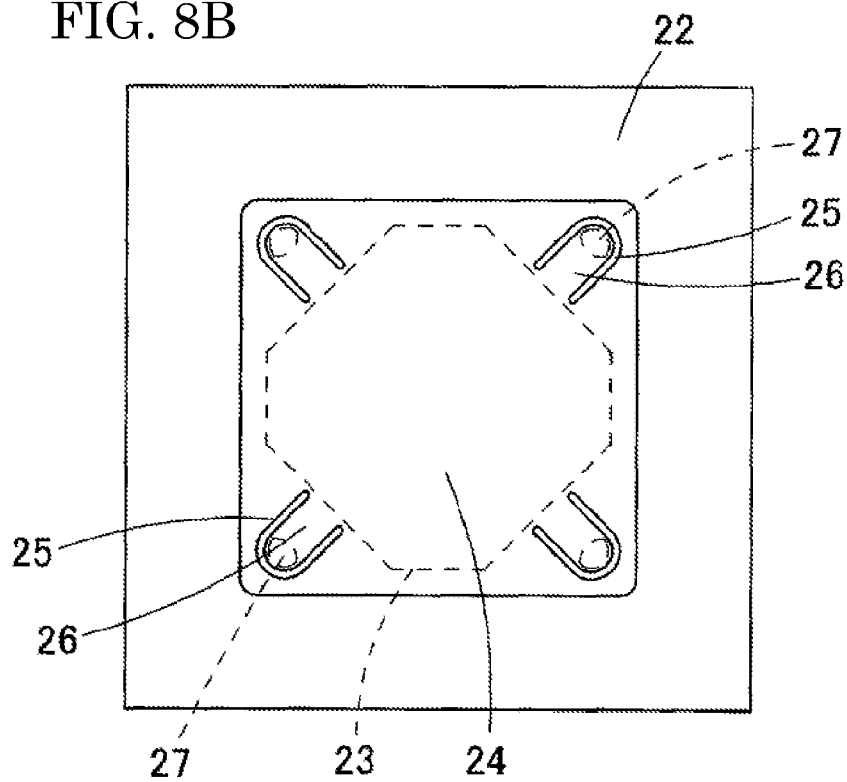
FIG. 8(B) is a plan view showing the acoustic sensor shown in FIG. 8(A), in a state in which a back plate and a fixed electrode plate have been removed to expose a diaphragm.
Figure 9:
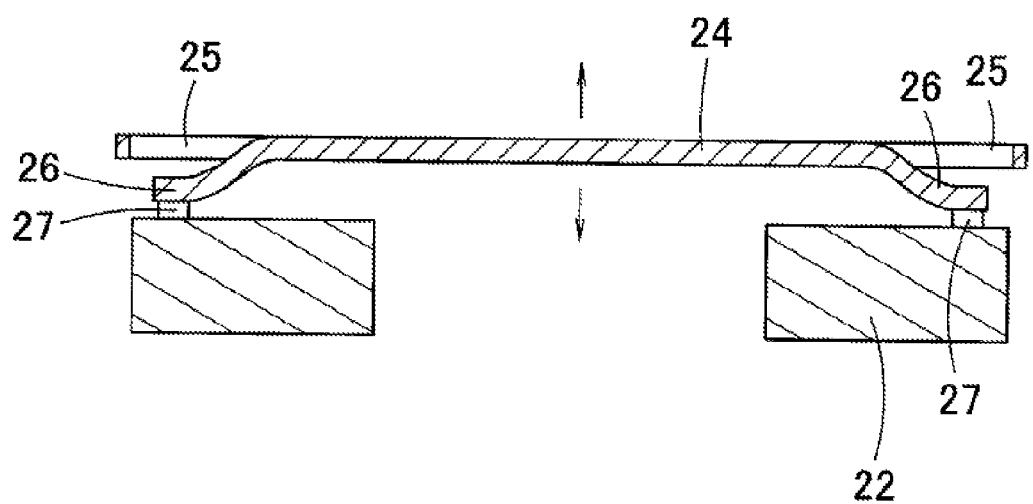
FIG. 9 is a cross-sectional diagram showing the diaphragm undergoing displacement in the acoustic sensor in FIG. 8(B).

FIG. 8(A) is a plan view showing an acoustic sensor 41 according to Embodiment 2 of the present invention. FIG. 8(B) is a plan view showing the acoustic sensor 41 in FIG. 8(A), in a state in which the back plate 28 and the fixed electrode plate 29 have been removed to expose the diaphragm 24. FIG. 9 is a cross-sectional diagram showing a state in which the diaphragm 24 has undergone displacement.

In the acoustic sensor 41 according to Embodiment 2 of the present invention as well, the leg pieces 26 extend in the diagonal directions of the diaphragm 24, but the end portions of the leg pieces 26 located on the central side of the diaphragm 24 are connected to the diaphragm 24, and the end portions on the outer peripheral side of the diaphragm 24 are supported by the anchors 27. Accordingly, in Embodiment 2, the leg pieces 26 extend outward from the diaphragm 24. Other aspects are similar to those in the case of Embodiment 1, and therefore portions of the configuration that are the same are denoted by the same reference signs, and descriptions will not be given for them.

In the case where the leg pieces 26 extend outward from the diaphragm 24 as in Embodiment 2 as well, the diaphragm 24 can undergo displacement or vibrate in the vertical direction due to the flexure of the narrow leg pieces 26 as shown in FIG. 9. Accordingly, the amount of displacement of the diaphragm 24 can be increased by the leg pieces 26, and the sensitivity of the acoustic sensor 41 can be raised.

With the acoustic sensor 41 of Embodiment 2 as well, it is possible to obtain the same or similar effects of the acoustic sensor 21 described in Embodiment 1.

Note that although FIG. 8(B) shows the chamber 23 that has an approximately octagonal shape, a chamber 23 having a cross shape as shown in FIG. 3(B) may be provided. Also, although the chamber 23 is formed so as to not be overlapped with the leg pieces 26 or the anchors 27 in a view from above in FIG. 8(B), there is no problem if the edges of the chamber 23 are extended to the vicinity of the anchors 27 such that the chamber 23 is overlapped with the leg pieces 26 and the anchors 27. Also, in the case of Embodiment 2 as well, an approximately octagonal diaphragm 24 (see FIG. 7(A)) or a circular diaphragm 24 (see FIG. 7(B)) may be used.

Manufacturing Steps for Acoustic Sensor of Embodiment 1, 2

Figure 10A:
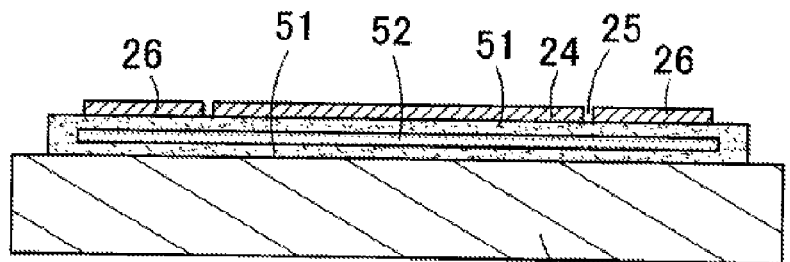
FIGS. 10(A) to 10(D) are schematic cross-sectional diagrams for describing manufacturing steps for the acoustic sensor of Embodiment 1 or 2.

Next, manufacturing steps for the acoustic sensors 21 and 41 of Embodiments 1 and 2 will be described with reference to FIGS. 10(A)-10(D) and 11(A)-11(C). First, as shown in FIG. 10(A), a first sacrifice layer 51 made of silicon oxide (SiO$_2$) is formed on the upper surface of the silicon substrate 22, a second sacrifice layer 52 made of polysilicon is stacked thereon, and then the first sacrifice layer 51 is again stacked on the second sacrifice layer 52 such that the second sacrifice layer 52 is covered by the first sacrifice layer 51. Next, a polysilicon film is formed on the upper surface of the first sacrifice layer 51, the polysilicon film is patterned to form the diaphragm 24 and the leg pieces 26, and then the slits 25 are formed between the diaphragm 24 and the leg pieces 26.

Figure 10B:
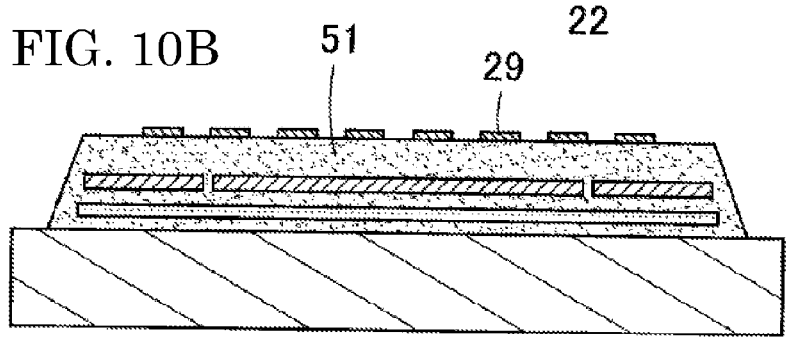

Thereafter, as shown in FIG. 10(B), the first sacrifice layer 51 is again stacked on the diaphragm 24 and the leg pieces 26 such that the diaphragm 24 and the leg pieces 26 are covered by the first sacrifice layer 51. Next, the outer peripheral surfaces of the first sacrifice layer are etched obliquely to form inclined surfaces. A GAP oxide film is formed on the upper surface of the first sacrifice layer 51, and the GAP oxide film is patterned to form the fixed electrode plate 29 on the upper surface of the first sacrifice layer 51. At this time, the acoustic holes 31 are also formed in the fixed electrode plate 29.

Figure 10C:
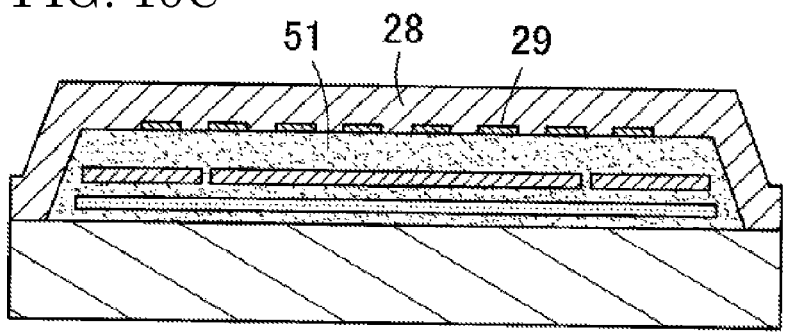
Figure 10D:
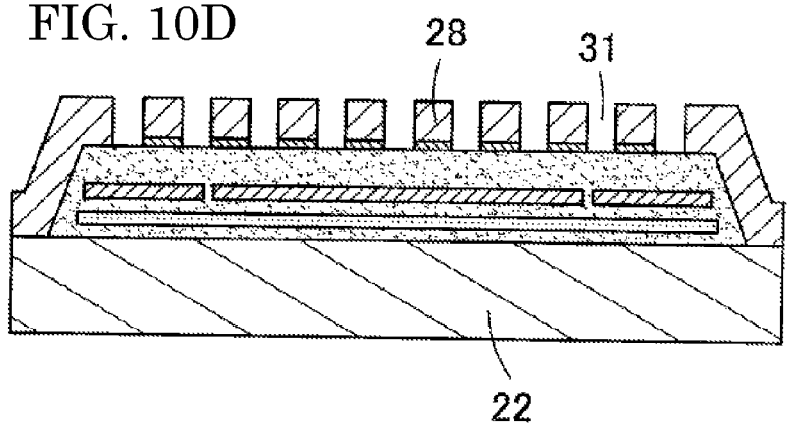

As shown in FIG. 10(C), the entirety of the stacked body on the upper surface of the silicon substrate 22 is covered by SiN to provide the back plate 28, and then as shown in FIG. 10(D), the acoustic holes 31 are formed in the back plate 28, and the lower surface of the silicon substrate 22 is polished to reduce the substrate thickness.

Figure 11A:
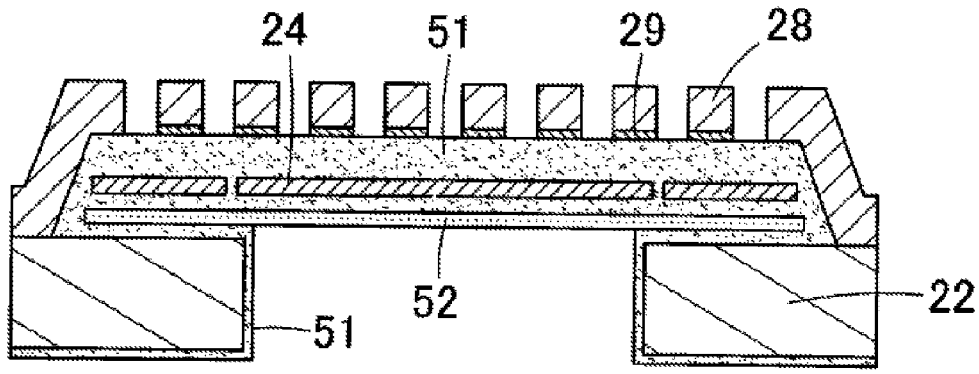
FIGS. 11(A) to 11(C) are schematic cross-sectional diagrams for describing steps in continuation from FIG. 10(D).

Next, as shown in FIG. 11(A), the silicon substrate 22 is subjected to dry etching (DRIE) on the lower surface side to form the chamber 23 in the silicon substrate 22. Thereafter, the lower surface of the silicon substrate 22 and the wall surfaces of the chamber 23 are protected by being covered by a first sacrifice layer 51.

Figure 11B:
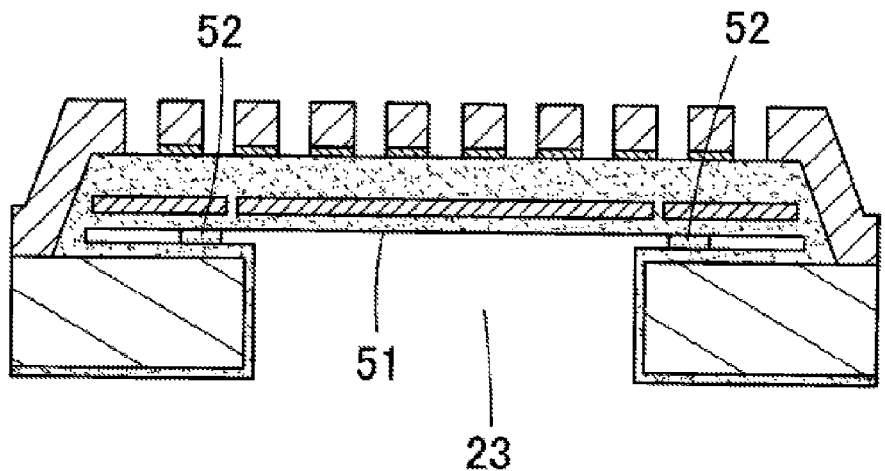

After the silicon substrate 22 has been protected by the first sacrifice layer 51 in this way, etching liquid is introduced into the chamber 23 to etch the second sacrifice layer 52 as shown in FIG. 11(B). At this time, etching is terminated so as to leave portions of the second sacrifice layer 52 remaining.

Figure 11C:
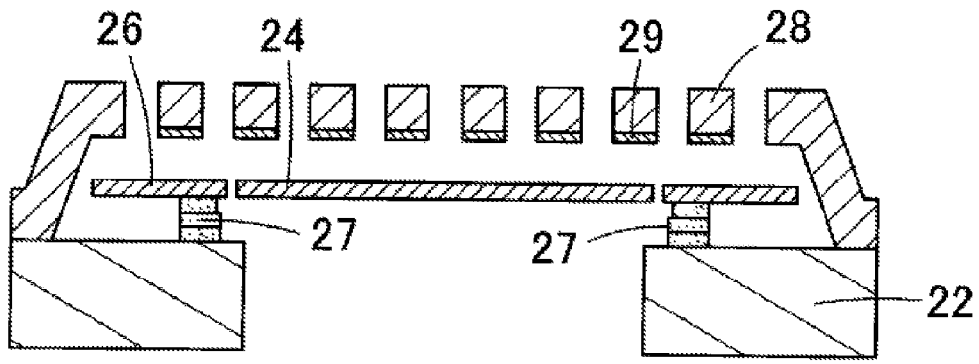

Thereafter, as show in FIG. 11(C), the first sacrifice layer 51 is removed by etching, thus forming the space inside the back plate 28.

Embodiment 3

Figure 14A:
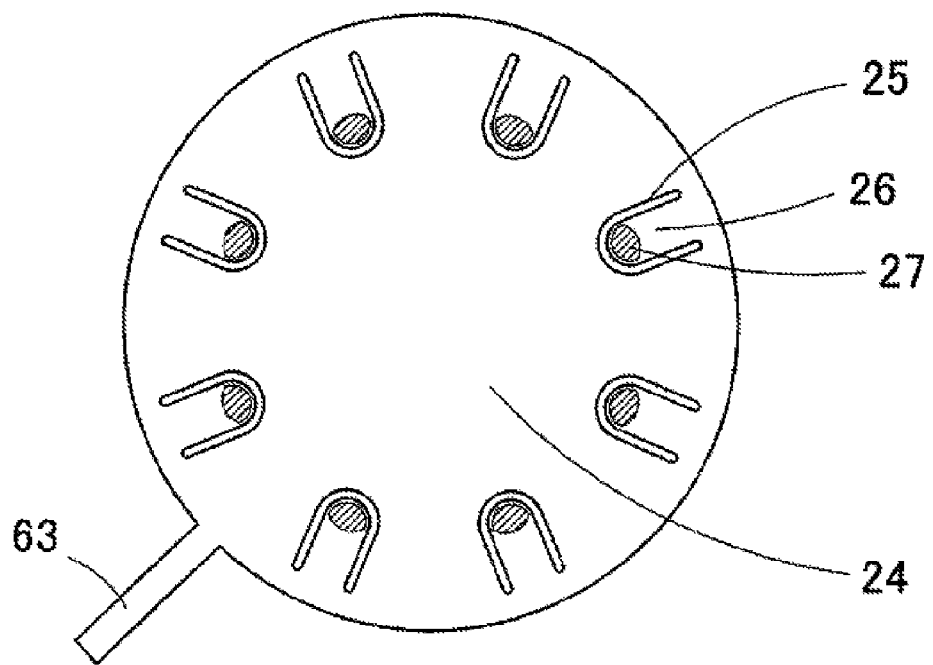
FIG. 14(A) is a plan view of a diaphragm used in the acoustic sensor of Embodiment 3.

FIG. 12 is a cross-sectional diagram showing an acoustic sensor 61 according to Embodiment 3 of the present invention. In this embodiment, the diaphragm 24 and the leg pieces 26 are not fixed to the upper surface of the silicon substrate 22, but rather are only placed on the upper surface of the silicon substrate 22. As shown in FIG. 14(A), the diaphragm 24 and the leg pieces 26 are separated by the slits 25, and this is similar to Embodiment 1. However, anchors are not provided on the upper surface of the silicon substrate 22, and the leg pieces 26 are not fixed to the upper surface of the silicon substrate 22. Accordingly, the diaphragm 24 and the leg pieces 26 can float away from the upper surface of the silicon substrate 22. Also, protrusions 62 are provided on the lower surface of the diaphragm 24 or the leg pieces 26, thus preventing the diaphragm 24 and the leg pieces 26 from coming into close contact with and not separating from the upper surface of the silicon substrate 22. As shown in FIG. 14(A), multiple anchors 27 are provided on the lower surface of the back plate 28 in correspondence with the upper surfaces of the tip portions of the leg pieces 26.

Figure 13:
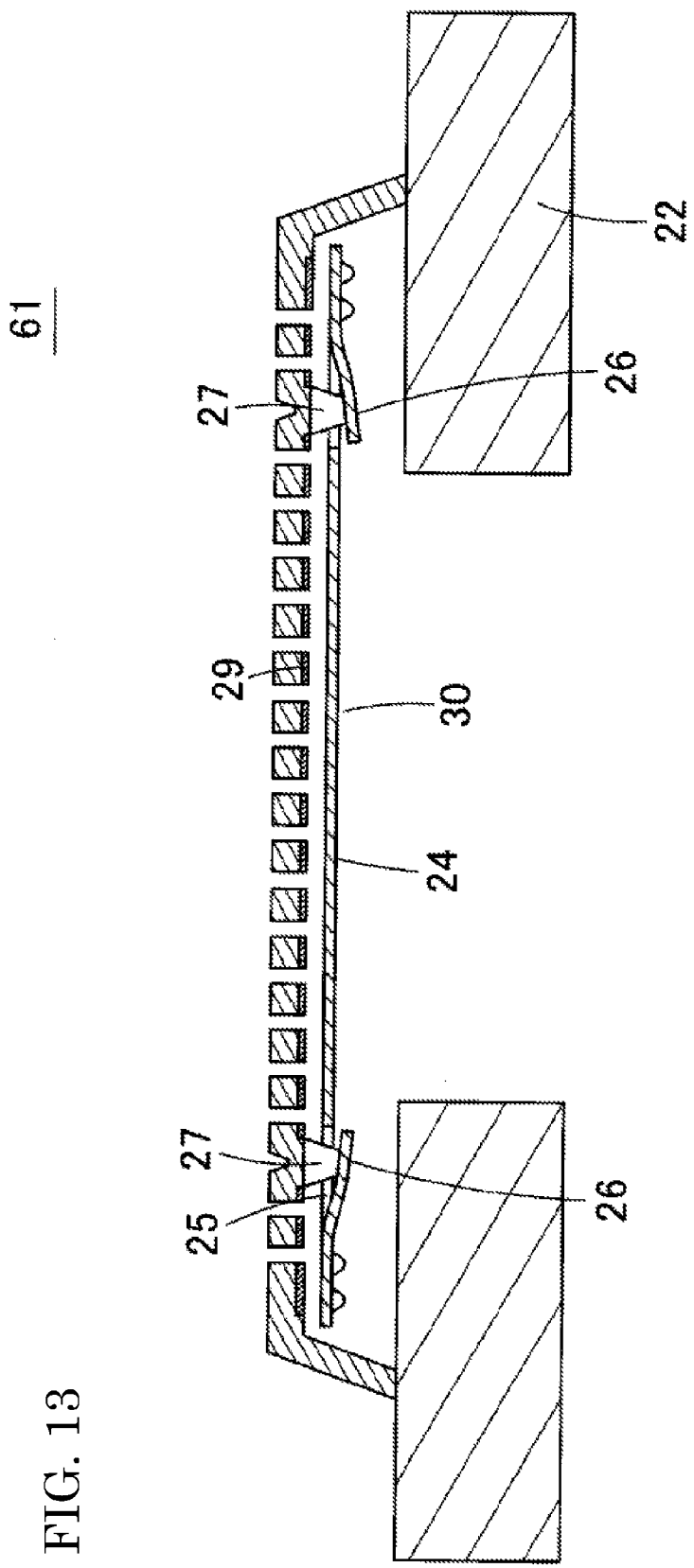
FIG. 13 is a cross-sectional diagram showing the acoustic sensor of Embodiment 3 in an operating state.

As shown in FIG. 12, when the acoustic sensor 61 is not operating, the diaphragm 24 and the leg pieces 26 are placed on the upper surface of the silicon substrate 22. However, when the acoustic sensor 61 enters the operating state, the diaphragm 24 and the leg pieces 26 are lifted upward as shown in FIG. 13 due to electrostatic attraction force acting between the fixed electrode plate 29 and the diaphragm 24. The leg pieces 26 that have been lifted upward come into contact with the anchors 27 as shown in FIG. 13, and the anchors 27 are pressed against the leg pieces 26 by the electrostatic attraction force between the fixed electrode plate 29 and the diaphragm 24. Accordingly, the leg pieces 26 are supported by the anchor 27 below the back plate 28, and the diaphragm 24 opposes the fixed electrode plate 29. Then, in the state of being suspended below the back plate 28, the diaphragm 24 becomes displaced or vibrates due to the acoustic vibration.

A lead-out interconnect 63 is drawn out from the diaphragm 24, and the lead-out interconnect 63 is led to the silicon substrate 22 or the back plate 28 side, thus making it unlikely for the diaphragm 24 to rotate when rising, and there is little risk of the leg pieces 26 becoming shifted from the anchors 27. However, in order to cause the leg pieces 26 to more reliably come into contact with the anchors 27, the diaphragm 24 may be provided with a rotation prevention means as necessary.

Figure 14B:
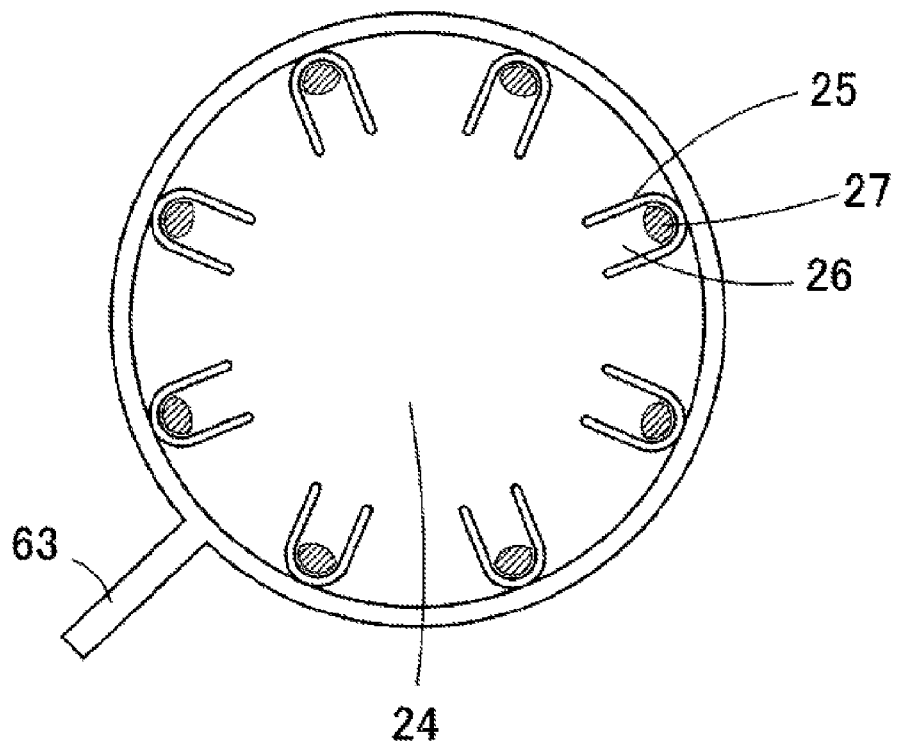
FIG. 14(B) is a plan view of another diaphragm used in the acoustic sensor of Embodiment 3.

Also, although the leg pieces 26 in FIG. 14(A) extend inward from the outer side of the diaphragm 24, the leg pieces 26 used in Embodiment 3 may extend outward from the inner side of the diaphragm 24 as shown in FIG. 14(B).

Note that although the diaphragm 24 and the leg pieces 26 are placed on the upper surface of the silicon substrate 22 when the acoustic sensor is not operating in Embodiment 3, a structure is possible in which the leg pieces 26 are fixed to the anchors 27 provided on the lower surface of the back plate 28, and the diaphragm 24 and the leg pieces 26 are always suspended below the back plate 28.

Embodiment 4

Figure 15:
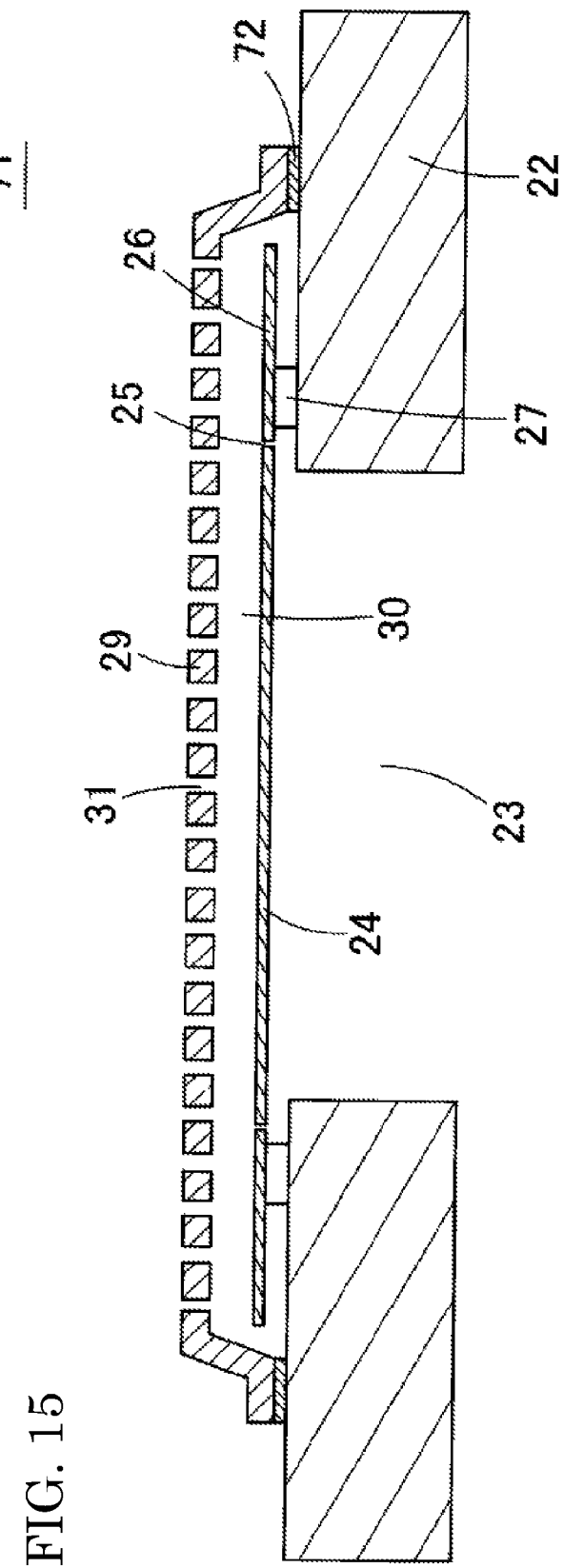
FIG. 15 is a cross-sectional diagram showing an acoustic sensor according to Embodiment 4 of the present invention.

FIG. 15 is a cross-sectional diagram showing an acoustic sensor 71 according to Embodiment 4 of the present invention. In this acoustic sensor 71, the fixed electrode plate 29 is formed with a dome shape and has a thickness sufficient for obtaining necessary rigidity. The fixed electrode plate 29 is provided on the upper surface of the silicon substrate 22 via an insulation layer 72 and covers the diaphragm 24 provided above the silicon substrate 22. A pressure sensor that does not use a back plate may be configured as in this embodiment.

Embodiment 5

Figure 16:
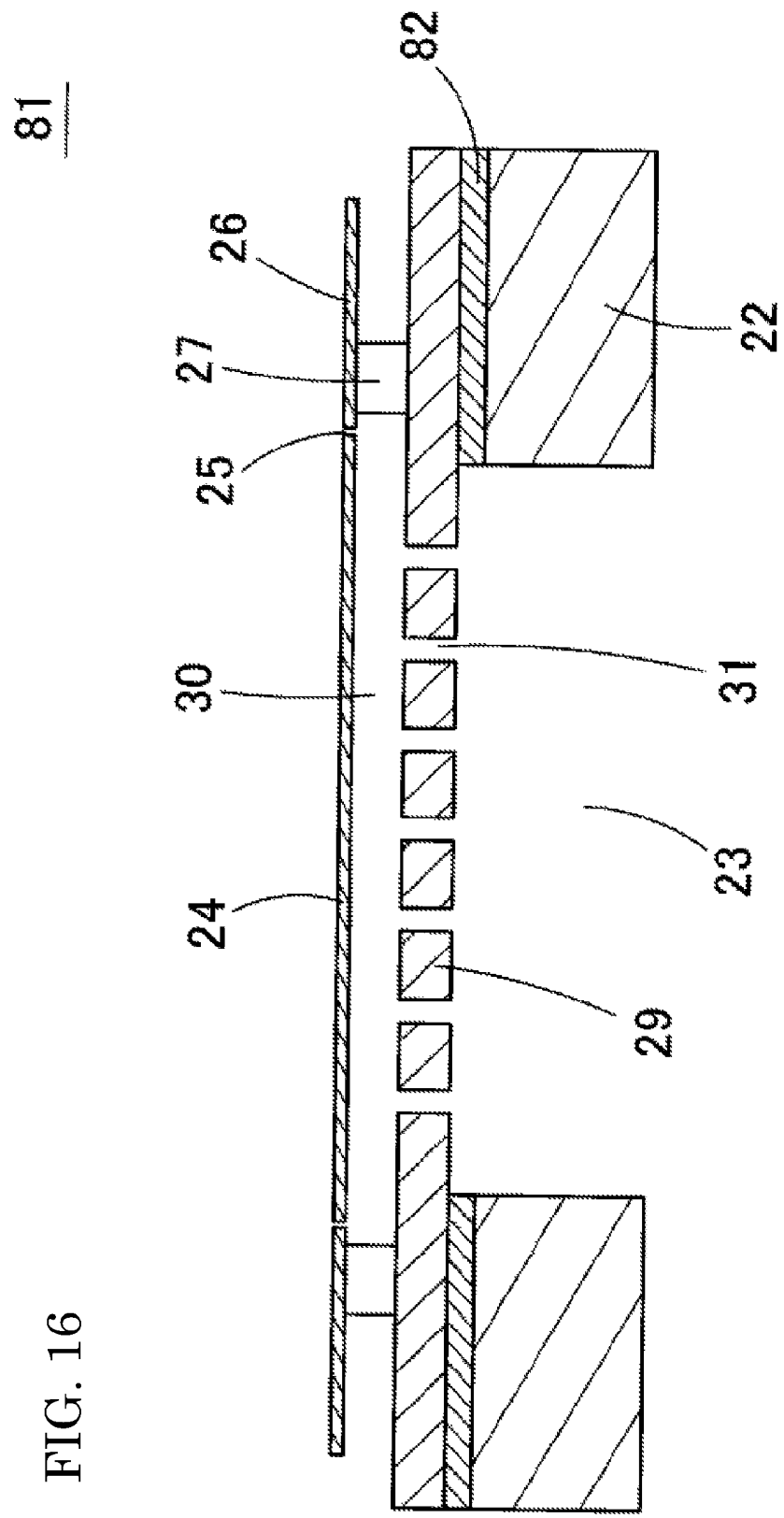
FIG. 16 is a cross-sectional diagram showing an acoustic sensor according to Embodiment 4 of the present invention.

FIG. 16 is a cross-sectional diagram showing an acoustic sensor 81 according to Embodiment 4 of the present invention. In this acoustic sensor 81, a fixed electrode plate 29 having a flat plate shape is provided on the upper surface of the silicon substrate 22 via an insulation layer 82. Furthermore, the diaphragm 24 is arranged above the fixed electrode plate 29 so as to oppose the fixed electrode plate 29. The leg pieces 26 connected to the diaphragm 24 are supported by the anchors 27 provided on the upper surface of the fixed electrode plate 29. Also, above the chamber 23, multiple acoustic holes 31 are formed in the fixed electrode plate 29. A pressure sensor may be configured such that the fixed electrode plate opposes the diaphragm below the diaphragm as in this embodiment.

Application in Microphone

Figure 17:
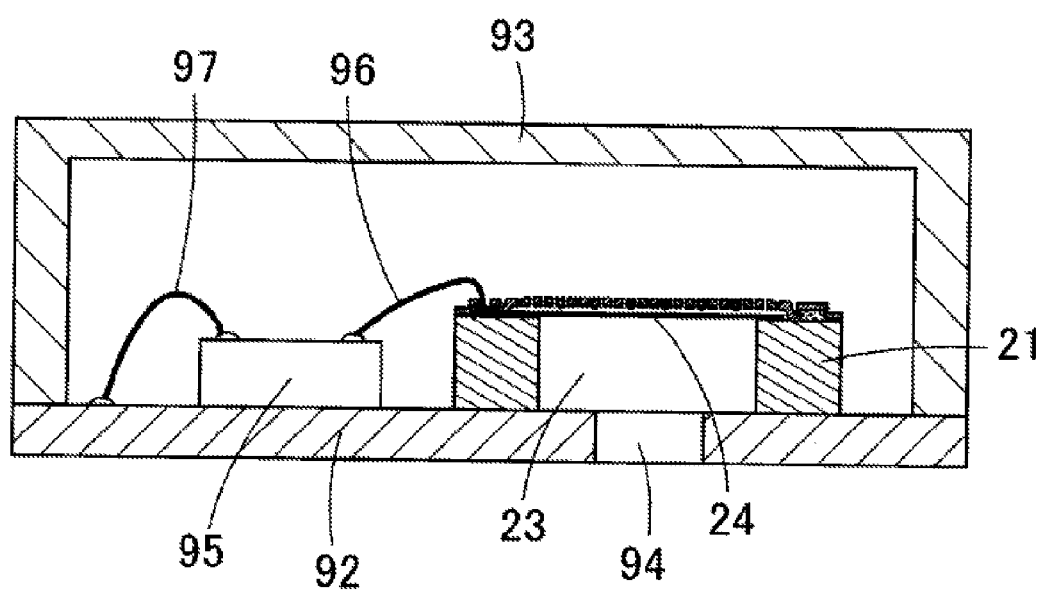
FIG. 17 is a schematic cross-sectional diagram of a microphone having an acoustic sensor according to the present invention built therein.

FIG. 17 is a schematic cross-sectional diagram of a bottom port type of microphone 91 having an acoustic sensor according to the present invention, such as the acoustic sensor 21 of Embodiment 1, built therein. This microphone 91 has the acoustic sensor 21 and a signal processing circuit 95 (ASIC), which is a circuit portion, built into a package made up of a circuit substrate 92 and a cover 93. The acoustic sensor 21 and the signal processing circuit 95 are mounted on the upper surface of the circuit substrate 92. A sound introduction hole 94 for the introduction of acoustic vibration into the acoustic sensor 21 is formed in the circuit substrate 92. The acoustic sensor 21 is mounted on the upper surface of the circuit substrate 92 such that the lower opening of the chamber 23 is aligned with the sound introduction hole 94 and covers the sound introduction hole 94. Accordingly, the chamber 23 of the acoustic sensor 21 is the front chamber, and the space inside the package is the back chamber.

The acoustic sensor 21 and the signal processing circuit 95 are connected by a bonding wire 96. Furthermore, the signal processing circuit 95 is connected to the circuit substrate 92 by a bonding wire 97. Note that signal processing circuit 95 has a function of supplying power to the acoustic sensor 21 and a function of outputting a capacitance change signal from the acoustic sensor 21 to the outside.

The cover 93 is attached to the upper surface of the circuit substrate 92 so as to cover the acoustic sensor 21 and the signal processing circuit 95. The package has an electromagnetic shielding function, and protects the acoustic sensor 21 and the signal processing circuit 95 from mechanical shock and electrical disturbances from the outside.

In this way, acoustic vibration that has entered the chamber 23 through the sound introduction hole 94 is detected by the acoustic sensor 21, and then output after being subjected to amplification and signal processing by the signal processing circuit 95. Since the space inside the package is the back chamber in this microphone 91, the volume of the back chamber can be increased, and the sensitivity of the microphone 91 can be increased.

Note that in this microphone 91, the sound introduction hole 94 for introducing acoustic vibration into the package may be formed in the upper surface of the cover 93. In this case, the chamber 23 of the acoustic sensor 21 is the back chamber, and the space inside the package is the front chamber.

The invention claimed is:

1. A capacitive sensor comprising:
   a substrate having a cavity that is open at least at an upper surface;
   a vibrating electrode plate formed above the substrate so as to cover an upper portion of the cavity;
   a fixed electrode plate arranged so as to oppose the vibrating electrode plate; and
   leg pieces are partially separated from the vibrating electrode plate by slits such that the leg pieces are surrounded by the vibrating electrode plate and are partially connected to the vibrating electrode plate;
   wherein
   the leg pieces are fixed to anchors provided on the substrate, and
   at least one of the anchors includes a through hole to which a part of a corresponding one of the leg pieces is inserted, such that the part of the corresponding leg piece is in contact with the substrate to electrically connect the substrate and the vibrating electrode plate through the part of the corresponding leg piece inserted in the through hole.

2. The capacitive sensor according to claim 1, wherein the leg pieces are located in an outer edge portion of the vibrating electrode plate.

3. The capacitive sensor according to claim 1, wherein the leg pieces extend from locations connected to the vibrating electrode plate, in a direction toward a center of the vibrating electrode plate.

4. The capacitive sensor according to claim 1, wherein the leg pieces extend from locations connected to the vibrating electrode plate, in a direction toward an outer periphery of the vibrating electrode plate.

5. The capacitive sensor according to claim 1, wherein each of the leg pieces is supported by the substrate via one of the anchors at one end portion of each of the leg pieces on a side opposite to the other end portion of each of the led pieces connected to the vibrating electrode plate.

6. The capacitive sensor according to claim 1, wherein the cavity extends into a region between the leg pieces in a view from a direction perpendicular to an upper surface of the substrate.

7. An acoustic sensor employing the capacitive sensor according to claim 1, wherein
   a plurality of holes for allowing passage of acoustic vibration are formed in the fixed electrode plate.

8. A microphone comprising the acoustic sensor according to claim 7 and a circuit portion that amplifies a signal from the acoustic sensor and outputs the amplified signal to an outside.

9. The capacitive sensor according to claim 1, wherein the ends of the slits are terminated with a circular hole.

10. A capacitive sensor comprising:
    a substrate having a cavity that is open at least at an upper surface;
    a diaphragm formed above the substrate so as to cover an upper portion of the cavity;
    a fixed electrode plate arranged opposite to the diaphragm; and
    a plurality of leg pieces partially separated from the diaphragm by slits such that the plurality of leg pieces are surrounded by the diaphragm and are partially connected to the diaphragm; and
    a plurality of anchors which are projected from a lower surface of a back plate formed on the fixed electrode plate at positions corresponding to the leg pieces;
    wherein
    the plurality of leg pieces are not fixed to the substrate,
    the plurality of leg pieces are not fixed to the back plate,
    in a state in which the capacitive sensor is not operated, the diaphragm with the plurality of leg pieces is placed on the substrate, and
    in a state in which the capacitive sensor is operated, the plurality of leg pieces are respectively supported by the plurality of anchors, with electrostatic attraction force between the fixed electrode plate and the diaphragm.

11. The capacitive sensor according to claim 10, wherein the leg pieces are located in an outer edge portion of the diaphragm.

12. The capacitive sensor according to claim 10, wherein the leg pieces extend from locations connected to the diaphragm, in a direction toward a center of the diaphragm.

13. The capacitive sensor according to claim 10, wherein the leg pieces extend from locations connected to the diaphragm, in a direction toward an outer periphery of the diaphragm.

14. The capacitive sensor according to claim 10, wherein each of the leg pieces is supported by a corresponding one of the anchors at one end portion of each of the leg pieces on a side opposite to the other end portion of each of the leg pieces connected to the diaphragm, in an operating state of the capacitive sensor.

15. The capacitive sensor according to claim 10, wherein the cavity extends into a region between the leg pieces in a view from a direction perpendicular to an upper surface of the substrate.

16. The capacitive sensor according to claim 10, wherein the ends of the plurality of slits are terminated with a circular hole.

17. The capacitive sensor according to claim 10, further comprising protrusions projected from a lower surface of the diaphragm or the leg pieces, wherein the protrusions prevents the diaphragm from coming into close contact with the substrate in a non-operating state of the capacitive sensor.

* * * * *